United States Patent [19]

Ogita

[11] 4,385,399
[45] May 24, 1983

[54] DISPLAY DEVICE

[75] Inventor: Minoru Ogita, Hamamatsu, Japan

[73] Assignee: Nippon Gakki Seizo Kabushiki Kaisha, Japan

[21] Appl. No.: 41,333

[22] Filed: May 22, 1979

[30] Foreign Application Priority Data

May 31, 1978 [JP] Japan .............................. 53-74968[U]

[51] Int. Cl.³ .......................... H03J 1/04; G09F 9/32
[52] U.S. Cl. .................................... 455/159; 455/158; 334/86; 340/767; 340/793
[58] Field of Search ............... 455/154, 156, 158, 159; 331/64; 334/86, 87, 30, 32, 36; 340/793, 767, 762, 782

[56] References Cited

U.S. PATENT DOCUMENTS

| | | | |
|---|---|---|---|
| 3,827,042 | 7/1974 | Mandzsu | 340/793 |
| 3,914,758 | 10/1975 | Ingle | 340/793 |
| 3,987,401 | 10/1976 | Irving | 455/159 |
| 4,117,407 | 9/1978 | Kusakabe | 455/154 |
| 4,135,158 | 1/1979 | Parmet | 455/159 |

Primary Examiner—Tommy P. Chin
Attorney, Agent, or Firm—Kane, Dalsimer, Kane, Sullivan and Kurucz

[57] ABSTRACT

A display device for digitally displaying a numerical value of plural figures on a display unit includes a detector for detecting the variation rate of the numerical value to be displayed. The brightness of a display section for an arbitrary figure of the numerical value is controlled in accordance with the detector output. The display device may be used in a radio receiver for displaying the receiving frequency.

4 Claims, 5 Drawing Figures

DISPLAY VALUE VARIATION RATE.

DISPLAY DEVICE

BACKGROUND OF THE INVENTION

This invention relates to a display device for digitally displaying the receiving frequency of a radio receiver or the like.

In a conventional display device of this type, the receiving frequency per se of a receiver or a local oscillation frequency corresponding to the receiving frequency is counted by a frequency counter, so that the receiving frequency is displayed on a display unit according to the count result of the frequency counter. The display device is so designed that a numerical value is displayed by suitable display elements such as light emission diodes in the display unit. For instance, in the case of an FM receiver whose receiving frequency range is from 76.0 MHz to 90 MHz, the receiving frequency of the receiver being tuned, such as 82.5 MHz or 90.0 MHz or the frequency of a broadcasting station when the receiver is completely tuned thereto, is displayed on the display unit. In this display device, the frequency displayed on the display unit is varied during the tuning operation of the receiver. For instance, if the receiving frequency is changed from 82.5 MHz to 90.0 MHz, the frequency display is changed 73 times as "82.6", "82.7", ... and "90.0". In this case, the following difficulty occurs: A numerical value displayed on the display unit is changed according to the rate of the tuning operation, and therefore it is difficult to read the displayed numerical value instantaneously; that is, it is difficult to find the tuning point instantaneously. The degree of the difficulty is increased as the receiving frequency is greatly changed as in the case where the receiver is tuned from the frequency of one broadcasting station to the frequency of another broadcasting station which is greatly different from the former. This is due to one of the characteristics of the eyes of a person; that is, the eyes of the operator tend to watch a changeable numerical value especially. For instance, in the above-described tuning operation, the 10th MHz digit and the first MHz digit are changed slowly, but the 100th KHz digit is changed quickly. Therefore, the operator watches the variation of the 100th KHz digit rather than the 10th MHz digit and the first MHz digit. As a result, it is difficult to instantaneously recognize the entire numerical value. Thus, the conventional display device suffers from the drawback that the tuning operation cannot be achieved in a short time.

SUMMARY OF THE INVENTION

Accordingly, a primary object of this invention is to provide a display device with which a numerical value changing with time can be readily read.

Another object of the invention is to provide a digital display device in which the brightness of a display section for an arbitrary figure in a numerical value to be displayed is controlled according to the rate of variation of the numerical value.

A further object of the invention is to provide a receiving frequency display device for a radio receiver, in which the brightness of a display section for a given figure of a numerical value to be displayed is controlled according to the rate of variation of the numerical value.

The novel features which are considered characteristic of this invention are set forth in the appended claims. This invention itself, however, together with additional objects and advantages thereof will be best understood from the following description taken in conjunction with the accompanying drawings which illustrate, by way of example only, some preferred embodiments of the invention.

DETAILED DESCRIPTION OF THE PREFERRED EMBODIMENTS

Figure 1:
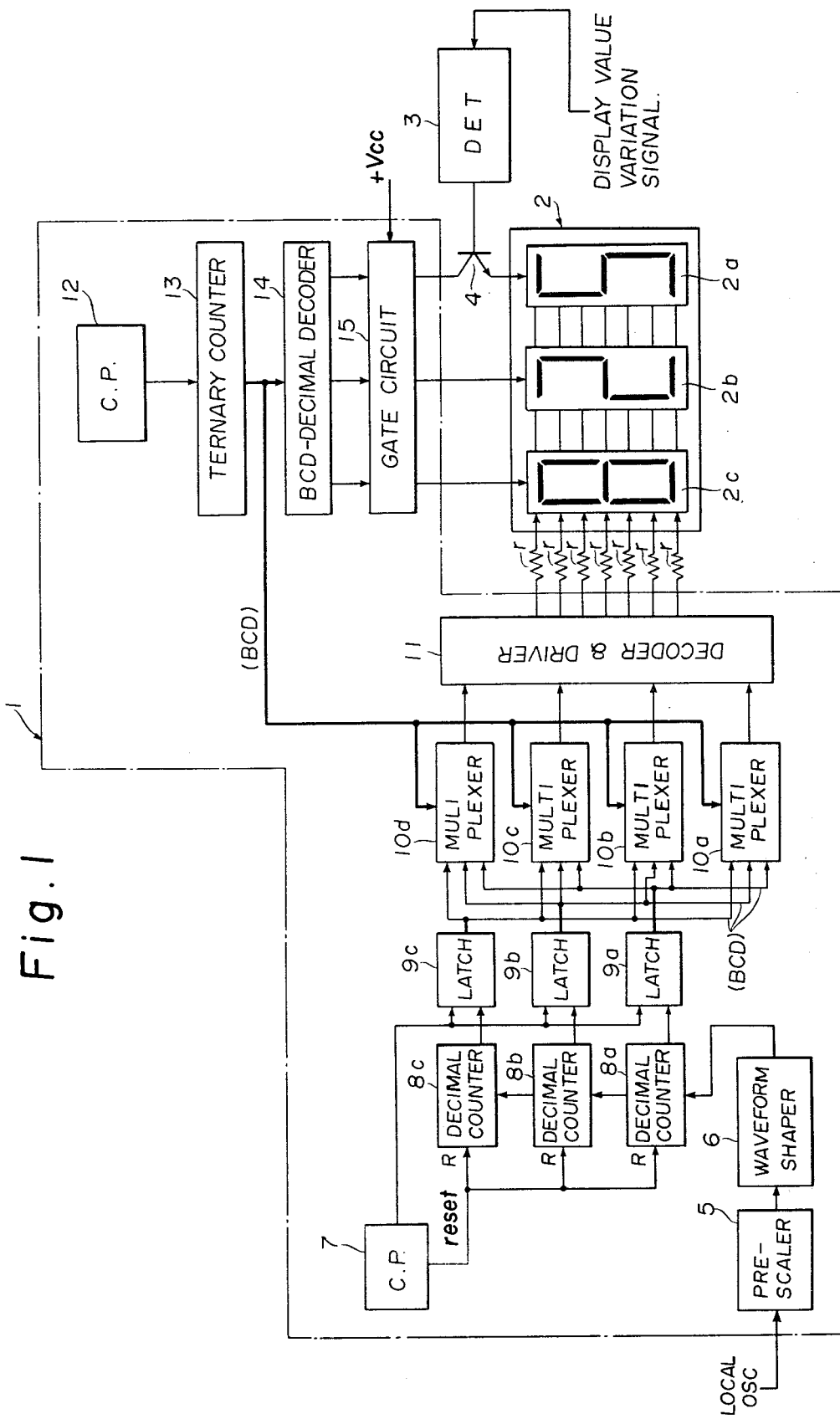
FIG. 1 is a block diagram showing a first example of a display device according to this invention, which is employed as the receiving frequency display device of an FM receiver.

FIGS. 1 through 4 show a first example of a display device according to this invention, which is employed as a receiving frequency display device in an FM receiver. The entire arrangement of the display device is as shown in FIG. 1.

A signal having a local oscillation frequency corresponding to a frequency received by the receiver is applied to a display unit drive circuit 1 formed according to a dynamic drive system, so that the receiving frequency is displayed in digital form on a display unit 2. In this operation, the rate of variation of a value displayed on the display unit 2 is detected by a display value variation rate detecting circuit 3, the detection output of which is supplied to the base of a transistor 4 serving as a variable resistance element adapted to control the brightness of the least significant figure (the hundredth KHz digit) on the display unit 2, so that the brightness of the least significant figure is controlled according to the rate of variation of the display value.

The signal having the aforementioned local oscillation frequency (LOCAL OSC) is applied to a pre-scaler 5 in the display unit drive circuit 1, where it is subjected to $1/10^3$ frequency division and is then applied to a waveform shaping circuit 6. The signal is subjected to waveform shaping in the circuit 6, and is then applied to a 3-digit decimal counter consisting of counters 8a (least significant figure), 8b (more significant figure) and 8c (most significant figure) so as to be counted. In this embodiment, the pre-scaler input is the local oscillation frequency signal so that a value corresponding to the intermediate frequency is suitably preset in the counters 8a, 8b and 8c. The pre-scaler input may be such a signal as represents the receiving frequency per se of the receiver. If so, such preset is unnecessary. A clock pulse (for instance 1 KHz) generated by a clock pulse generator 7 is applied, as a reset signal, to the reset input terminal R of each of the counters 8a through 8c. Thus, the contents of the counters 8a through 8c are reset every millisecond, so that the count period of each counter 8a, 8b or 8c is set to 1 millisecond. The digit outputs (count values) of the counters 8a through 8c are applied to latch circuits 9a through 9c, respectively. The digit outputs are latched by the latch circuits 9a through 9c when the clock pulse from the clock pulse generator 7 is applied to the latch circuits 9a through 9c, respectively. The digit outputs latched by the latch circuits 9a through 9c are outputted as data expressed in BCD (binary coded decimal) code. The data thus outputted are applied to multiplexers 10a, 10b, 10c and 10d separately according to the digits. These multiplexers 10a through 10d are timing-controlled according to the contents of a ternary counter 13 described later, as a result of which the outputs of the latch circuits 9a, 9b and 9c are read out of the multiplexers 10a through 10d successively and separately according to the digits, and are supplied to a binary coded decimal seven-segment decoder and driver 11. The signals supplied to the decoder/driver 11 separately according to the digits, are outputted from the decoder/driver 11 as segment drive signals for displaying numeral data separately according to the digits, and are applied in a parallel mode to the display unit 2 through resistors r.

The ternary counter 13 operates to count clock pulses which are generated by a clock pulse generator 12 with a predetermined timing and are applied to the counter 13, and to output its count values "0", "1" and "2" (in decimal notation) in BCD codes. The count values are applied to both the multiplexers 10a through 10d and a BCD-decimal decoder 14 simultaneously. In the BCD-decimal decoder 14, signals are produced according to the contents "0", "1" and "2" of the count values of the ternary counter 13. The signals are applied to a gate circuit 15 gating the supply of a digit drive signal to the display unit 2. When the contents of the count values of the ternary counter 13 are "0", "1" and "2", the contents of the digit drive signals supplied to the display unit 2 select the least significant digit (the 100th KHz digit, a display section 2a), the more significant digit (the first MHz digit, a display section 2b) and the most significant digit (the 10th MHz digit, a display section 2c) on the display unit 2, respectively. The digit drive signal which is adapted to select the display section 2a (the least significant digit) of the display unit 2 is applied to the gate circuit 15 and controls the supply of the digit drive signal to the display section 2a through the transistor 4.

The display unit 2 comprises the aforementioned display sections 2a, 2b and 2c, each of which is made up of seven light emitting segments such as light emission diodes which are arranged in a mosaic pattern to display numerals. As was described above, the display sections 2a, 2b and 2c are adapted to display the 100th KHz digit, the first MHz digit and the 10th MHz digit, respectively.

In tuning the receiver, the frequency displayed on the display unit 2 is varied as the receiving frequency of the receiver is varied. The degree of variation in this display is detected by the display value variation rate detecting circuit 3, so that the level of the digit drive signal supplied to the display section 2a is controlled by the detection output of the detecting circuit 3 thereby to control the brightness of the display section 2a.

Figure 2:
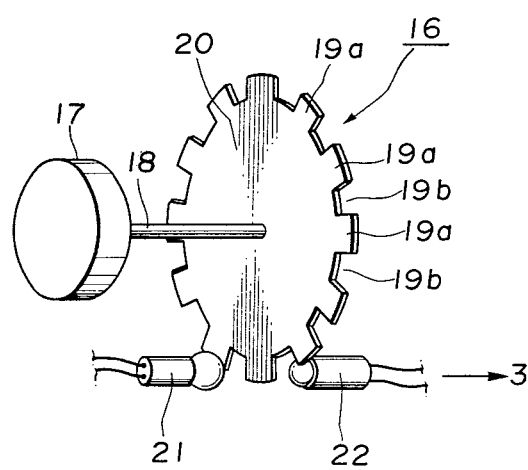
FIG. 2 is a perspective view showing an example of an encoder employed in the first example of the display device shown in FIG. 1.

The variation of the frequency displayed on the display unit 2, that is, the variation of the frequency received by the receiver is provided as an electrical signal by a display control signal detecting means which, as shown in FIG. 2, comprises an encoder 16 for instance. The electrical signal thus provided is applied to the display value variation rate detecting circuit 3.

The encoder 16, as shown in FIG. 2, comprises: a disk 20 mounted on a shaft 18 of a tuning knob 17 interlocked with a tuning element in the receiver, the disk having light intercepting portions 19a, and light passing portions 19b like slots alternately at the periphery thereof; and a light emitting element 21 such as a light emission diode and a light sensitive element 22 such as a photo-transistor which are disposed on opposite sides of the disk 20 so that the light intercepting portions 19a and the light passing portions 19b pass between the two elements 21 and 22 alternately. As the tuning knob 17 is operated, the disk 20 is rotated, as a result of which light from the light emitting element 21 is allowed to intermittently reach the light sensitive element 22 by means of the light intercepting portions 19a and the light passing portions 19b of the disk 20. Thus, the light sensitive element 22 produces a pulse signal which is applied, as a receiving frequency variation signal (display control signal) to the display value variation rate detecting circuit 3.

Figure 3:
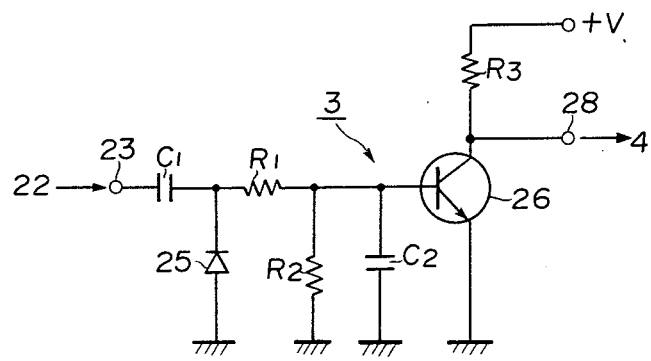
FIG. 3 is a circuit diagram showing a concrete example of a display value variation rate detecting circuit in FIG. 1.

The display value variation rate detecting circuit 3 is formed as shown in FIG. 3. The pulse signal from the encoder 16 is applied through the input terminal 23 and a capacitor $C_1$ connected thereto to a diode 25, where it is rectified. The signal thus rectified is smoothed by a smoothing circuit comprising resistors $R_1$ and $R_2$ and a capacitor $C_2$ and is then applied to the base of a transistor 26, whereby the collector current of the transistor 26 supplied from a voltage source $+V$ through a load resistor $R_3$ is controlled according to the base potential thereof. In this operation, a voltage developed at the collector of the transistor 26 is obtained as an output signal at the output terminal 28. The output signal is applied to the base of the above-described transistor 4.

The operation of the above-described first example of the display device according to the invention will be described hereunder.

Figure 4:
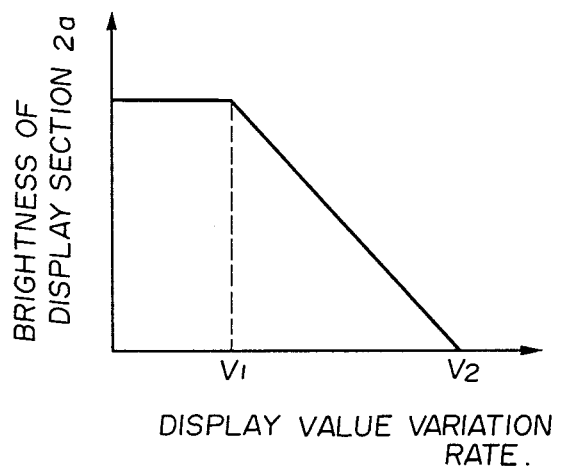
FIG. 4 is a graphical representation indicating the relationship between the display value variation rate of a display unit and the brightness of a display section in the display unit in FIG. 1.

When the receiving frequency of the receiver is set to a particular value, then the display unit 2, being driven by the display unit drive circuit 1, displays the receiving frequency, for instance 82.5 MHz as shown in FIG. 1. If, under this condition, the tuning knob 17 is operated to change the frequency, then the display on the display unit 2 is changed accordingly. This change, i.e., the change of the receiving frequency is converted into an electrical signal by the encoder 16, and the electrical signal is applied to the display value variation rate detecting circuit 3. In this circuit 3, a voltage corresponding to the rate of variation of the receiving frequency is outputted. The voltage thus outputted is applied to the base of the transistor 4. The transistor 4, according to its base potential, controls the digit drive signal supplied to the display section 2a of the display unit 2 from the display unit drive circuit 1, thereby to control the brightness of the display unit 2a. In this connection, the relationship between the rate of variation of a receiving frequency, i.e., the display value variation rate and the emitter potential of the transistor 4, i.e., the brightness of the display section 2a of the display unit is indicated in FIG. 4. As is apparent from the graphical representation in FIG. 4, when the display value variation rate of the display unit 2 exceeds a predetermined value $V_1$, the brightness of the display section 2a is decreased in proportion to the variation rate. When the variation rate exceeds a value $V_2$, the display section 2a is turned off.

Thus, in the tuning operation of the receiver, the brightness of a numeral displayed on the display section 2a is controlled in accordance with the display value variation rate of the display unit 2. Accordingly, in the value display on the display unit 2, the value display of the display section 2a which is changed most frequently is decreased in brightness or it is turned off as the display value variation rate increases. Therefore, the operator tuning the receiver can recognize the numerals of the display sections 2b and 2c (the first MHz digit, and the 10th MHz digit) which are changed slowly, without being interrupted by the numeral which is displayed on the display section 2a (the 100th KHz digit) changing quickly. Thus, the operator can read the receiving frequency at a glance, that is, he can readily tune the receiver to a desired frequency. In the case when the tuning operation is carried out slowly in the vicinity of the frequency of a desired station, the brightness of the display section 2a is substantially recovered to thereby ensure an exact tuning.

Figure 5:
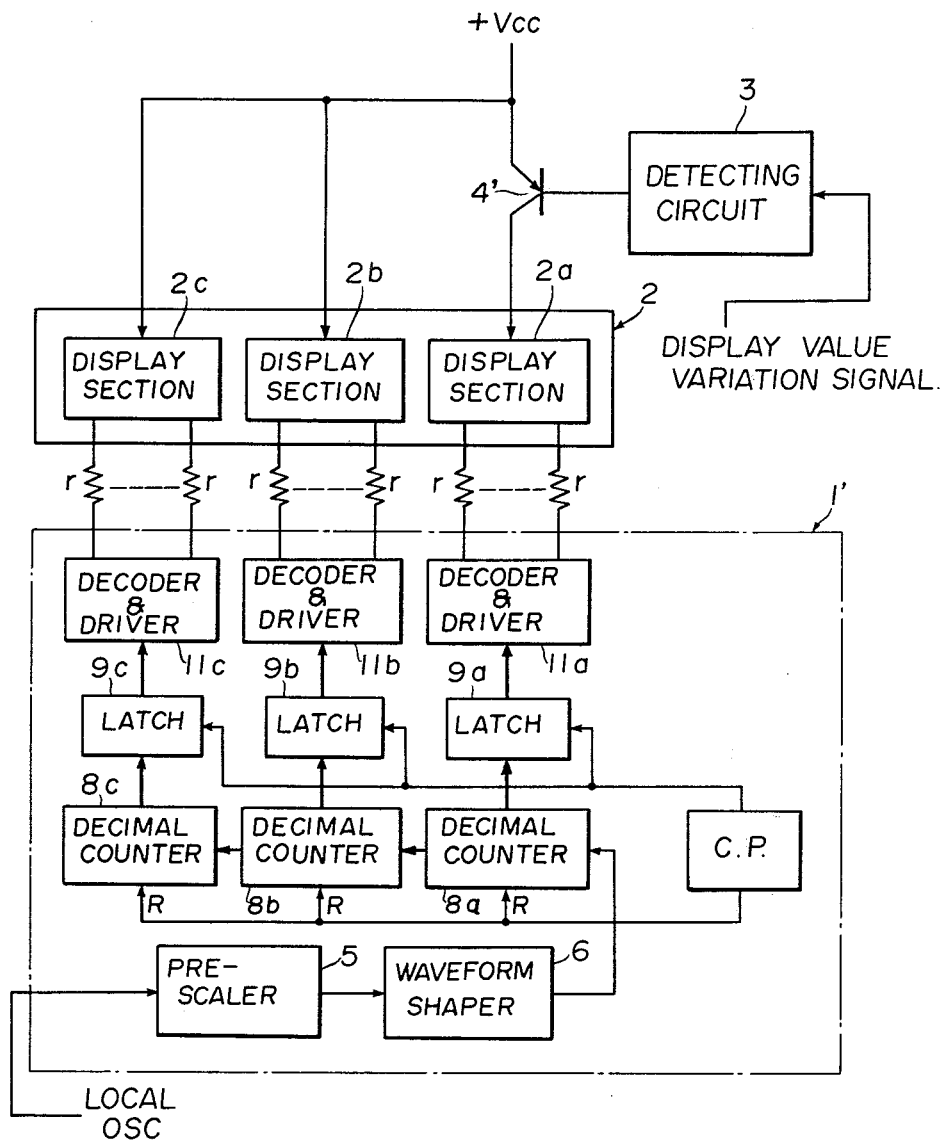
FIG. 5 is a block diagram showing a second example of the display device according to the invention, which is employed as the receiving frequency display device of an FM receiver.

Shown in FIG. 5 is a second example of the receiving frequency display device according to the invention, in which a display unit drive circuit 1' according to a static drive system is employed. In order to simplify the description of the second example, in FIG. 5 those components which have been previously described with reference to FIG. 1 are similarly numbered. Binary coded decimal (BCD) seven-segment decoders and drivers 11a, 11b and 11c are connected respectively to the output sides of the latch circuits 9a, 9b and 9c adapted to latch the digit outputs of the decimal counters 8a, 8b and 8c in the display unit drive circuit 1'. The outputs of the BCD seven-segment decoder/drivers 11a, 11b and 11c are applied, as numeral data displaying segment drive signals, to the display sections 2a, 2b and 2c of the display unit 2 through resistors r, respectively. A voltage Vcc from a voltage source (not shown) is applied through a transistor (variable resistance element) 4' to the display section 2a. The voltage Vcc is applied directly to the remaining display sections 2b and 2c. Similarly as in the above-described transistor 4, the transistor 4' is provided for controlling the brightness of the display section 2a. The detection output of the display value variation rate detecting circuit 3 is applied to the base of the transistor 4'.

The operation of the second example of the display device is similar to that of the first example, and therefore its detailed description will be omitted. In the second example also, the brightness of a numeral displayed on the display section 2a is controlled as indicated in FIG. 4, and therefore the digits displayed on the display unit 2 can be readily visually recognized.

In each of the examples described above, the input signal to the display value variation rate detecting circuit 3 is obtained from the encoder 11 shown in FIG. 2; however, the input signal may be obtained from the segment drive signal supplied from the display unit drive circuit 1 or 1' to the display unit 2.

Furthermore, the brightness control of the display unit 2 is not limited to the proportional curve control as shown in FIG. 4; that is, the brightness of the display unit 2 may be controlled in accordance with a step curve control or a non-linear curve control.

In the above-described examples, the brightness of the least significant figure is controlled; however, it is possible to control the brightness of the two less significant figures or the brightness of all of the figures. In addition, the number of figures displayed on the display unit 2 is not limited to three; that is, it may be selected as desired.

The invention has been described with reference to its preferred examples in which the display device according to the invention is employed as the receiving frequency display device of a radio receiver. However, it should be noted that the invention is not limited thereto or thereby. That is, it may be employed as a numerical value display device for various industrial equipments. In the latter case, the brightness control may be applied to the display section of an arbitrary figure in accordance with the purpose of use of the equipment.

As is apparent from the above description, according to the invention, the brightness of the display section of a given place in the display unit is controlled in accordance with the display value variation rate. Accordingly, in displaying a plurality of figures, the brightness of a digit displayed in a place where the digit is quickly altered can be decreased, or the display of the digit can be eliminated. Thus, the display in each instant can be easily recognized without nettling the viewer's eyes even when a numerical value to be displayed changes quickly.

What is claimed is:
1. A display device comprising:
a displaying unit having a plurality of display sections provided respectively for a plurality of figures of a numerical value representatively of a receiving frequency of a radio receiver to digitally display said numerical value with brightness and being capable of displaying said numerical value which alters with time in response to variation of said receiving frequency of said receiver;
a display unit drive circuit which receives a frequency display signal having a frequency corresponding to said receiving frequency of said receiver, and according to said frequency display signal, drives said display unit to permit said display sections thereof to display said numerical value of said receiving frequency;
means for generating a display control signal representing the variation rate of said frequency display signal;
a display value variation rate detecting circuit for receiving said display control signal to detect the variation rate of said frequency display signal; and
a brightness control circuit for receiving a detection output of said display value variation rate detecting circuit to control the brightness of a display section provided for an arbitrary figure among said plurality of figures in accordance with the variation rate of said frequency display signal.

2. A display device as claimed in claim 1, in which said brightness control circuit comprises means for reducing the brightness of said display section as said display value variation rate increases.

3. A display device as claimed in claim 2, in which said brightness control circuit comprises means for controlling the brightness of the display section provided for the least significant figure of said numerical value.

4. A display device as claimed in claim 1, in which each display section of said display unit comprises a plurality of light emitting segments which are selectively driven in accordance with a digit to be displayed, thereby to display said numerical value;
said display unit drive circuit comprises means for outputting segment drive signals for selectively driving said light emitting segment by receiving said frequency display signal of said receiver;

said display control signal generating means comprises means for outputting said display control signal by detecting the rotating speed of operating a tuning knob of said receiver; and said brightnesss control circuit comprises a variable resistance element for controlling a current flowing said digit and being controlled by said detection output of said display value variation rate detecting circuit.

* * * * *